US008760844B2

(12) United States Patent
Baron et al.

(10) Patent No.: US 8,760,844 B2
(45) Date of Patent: Jun. 24, 2014

(54) DEVICES HAVING A DIAMOND-LIKE-CARBON DIELECTRIC

(75) Inventors: William G. Baron, Springfield, OH (US); Jeffrey A. Brogan, Stony Brook, NY (US); Sandra Fries-Carr, Dayton, OH (US); Richard J. Gambino, Port Jefferson, NY (US); Christopher Gouldstone, Huntington, NY (US); Brian Keyes, Patchogue, NY (US); Sanjay Sampath, Setauket, NY (US); Huey-Daw Wu, Stony Brook, NY (US); Richard L. C. Wu, Beavercreek, OH (US)

(73) Assignee: Mesoscribe Technologies, Inc., St. James, NY (US)

( * ) Notice: Subject to any disclaimer, the term of this patent is extended or adjusted under 35 U.S.C. 154(b) by 256 days.

(21) Appl. No.: 13/207,267

(22) Filed: Aug. 10, 2011

(65) Prior Publication Data

US 2012/0039017 A1 Feb. 16, 2012

Related U.S. Application Data

(60) Provisional application No. 61/373,554, filed on Aug. 13, 2010.

(51) Int. Cl.
*H01G 4/06* (2006.01)
*H01G 9/00* (2006.01)

(52) U.S. Cl.
USPC .......................................... 361/311; 361/330

(58) Field of Classification Search
USPC .......................... 361/311–313, 320, 328–330
See application file for complete search history.

(56) References Cited

U.S. PATENT DOCUMENTS

| 4,989,119 | A | * | 1/1991 | Gouvernelle | 361/534 |
| 6,981,671 | B1 | * | 1/2006 | Baron et al. | 244/1 A |
| 7,864,505 | B1 | * | 1/2011 | O'Brien et al. | 361/311 |
| 2011/0043963 | A1 | * | 2/2011 | Bultitude et al. | 361/321.4 |

FOREIGN PATENT DOCUMENTS

WO    WO 2007-125282    11/2007
WO    WO 2010-010363    8/2011

OTHER PUBLICATIONS

Snyder et al., Multifunctional Structural Composite Supercapacitors, Proceedings of 27th U.S. Army Science Conference, Nov. 29, 2010.
Colin Smith, "Cars of the Furture Could Be Powered by Their Bodywork Thanks to New Battery Technology," Imperial College News Release, Feb. 5, 2010.
Emma Woollacott, "Future Cars Could Have the Battery on the Outside," Imperial College News Release, Feb. 5, 2010.
Dan Johnston, Q&A: Per-Ivar Sellergren, Inventor of Volvo's Cutting-Edge Body Panel Battery Technology, Km: Kilometer Magzine, Mar. 17, 2010.

* cited by examiner

*Primary Examiner* — Eric Thomas
(74) *Attorney, Agent, or Firm* — F. Chau & Associates, LLC

(57) ABSTRACT

A structural capacitor includes a first carbon fiber material layer, a second carbon fiber material layer, and an interlayer dielectric including a diamond-like-carbon material layer.

10 Claims, 5 Drawing Sheets

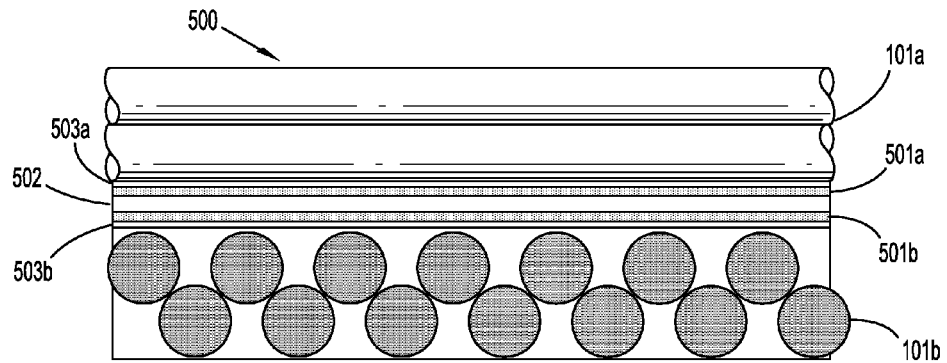
FIG. 5
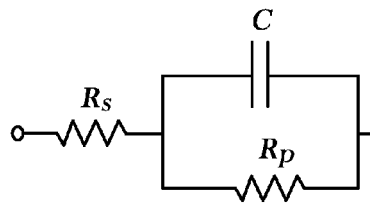
FIG. 6A  FIG. 6B
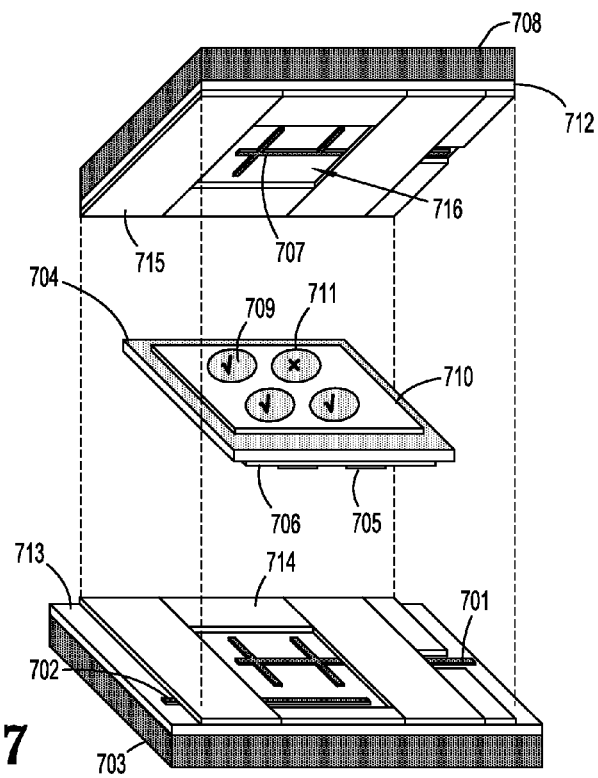
FIG. 7

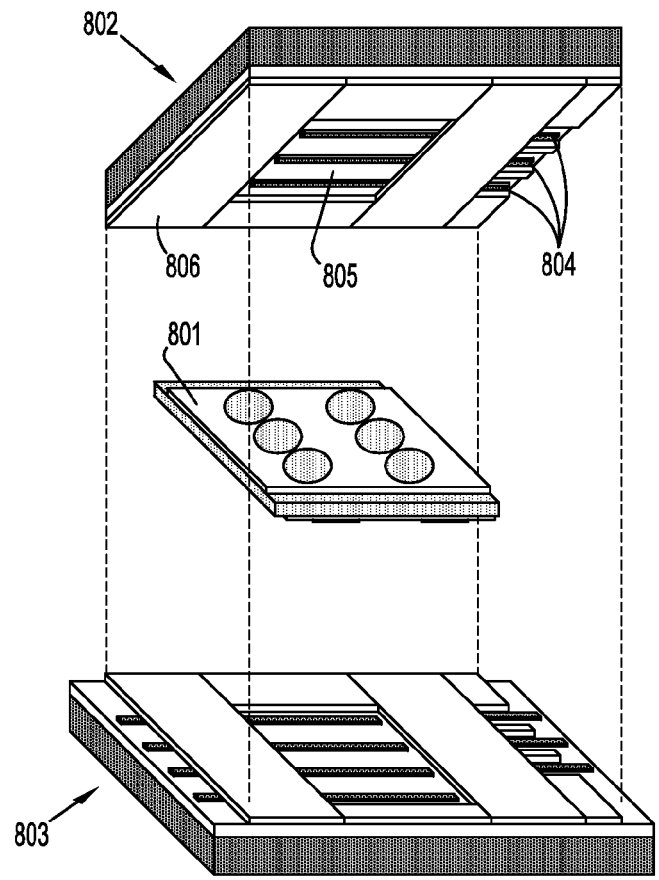
FIG. 8A
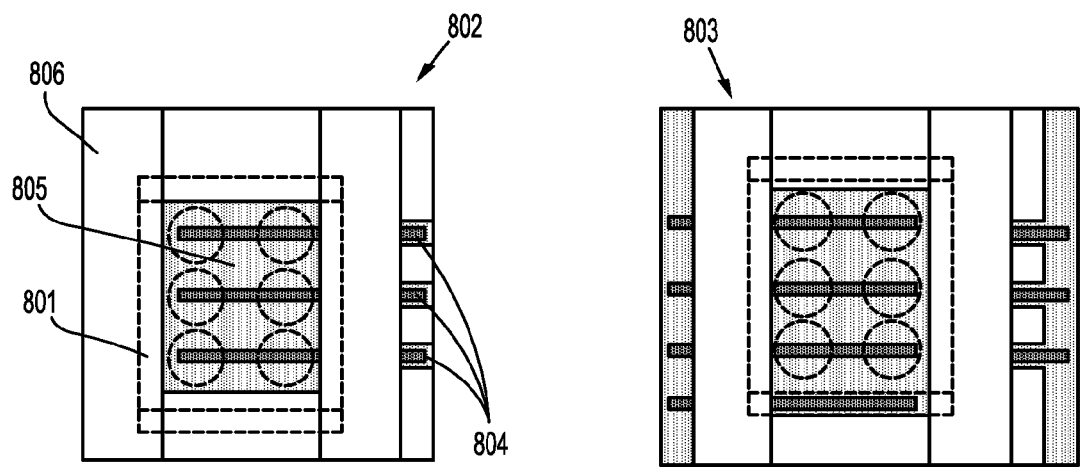
FIG. 8B  FIG. 8C

DEVICES HAVING A DIAMOND-LIKE-CARBON DIELECTRIC

CROSS REFERENCE TO RELATED APPLICATIONS

This application claims priority to and the benefit of Provisional Application Ser. No. 61/373,554, filed on Aug. 13, 2010, the contents of which are herein incorporated by reference in their entirety.

STATEMENT REGARDING FEDERALLY SPONSORED RESEARCH OR DEVELOPMENT

This invention was made with Government support under Contract No.: FA8650-07-C-3715 awarded by the U.S. Air Force. The Government has certain rights in this invention.

BACKGROUND OF THE INVENTION

1. Technical Field

The present invention relates to capacitor devices, and more particularly to a capacitor having a diamond-like-carbon dielectric.

2. Discussion of Related Art

Structural capacitor functional material systems have been designed in order to store and retrieve large amounts of energy. It has been shown that a capacitor can be formed by laminating a sheet of paper about 40 μm thick between carbon fiber/epoxy prepreg sheets. The paper serves as a dielectric and the carbon fibers serve as plates of a parallel plate capacitor. Several kinds of paper and epoxy combinations have been tried as the dielectric, with ordinary paper being the only one that could be successfully used to produce a functioning capacitor.

The functional performance of the structural capacitor produced with paper as the dielectric is poor. The dielectric constant is low and the thickness is high so the capacitance per unit area is low; the dielectric breakdown is low (15 kV/mm) so the energy storage per unit area is only 0.11 J/mm$^2$. Also, paper has poor strength so incorporating thick layers of paper into the carbon fiber/epoxy composite may cause a large deficit in structural performance.

Therefore, a need exists for a capacitor having an improved dielectric.

SUMMARY OF THE INVENTION

According to an embodiment of the present disclosure, a structural capacitor includes a first carbon fiber material layer, a second carbon fiber material layer, and an interlayer dielectric including a diamond-like-carbon material layer.

According to an embodiment of the present disclosure, a structural capacitor includes a first carbon fiber material layer, a second carbon fiber material layer and an interlayer dielectric. The interlayer dielectric includes first and second diamond-like-carbon material layers deposited on respective sides of a metallic foil and first and second outer metallic films formed on respective first and second diamond-like-carbon material layers, wherein the interlayer dielectric is laminated between the first and second carbon fiber material layers.

BRIEF DESCRIPTION OF THE DRAWINGS

Preferred embodiments of the present invention will be described below in more detail, with reference to the accompanying drawings:

FIG. 5 is a diagram of a structural capacitor having DLC films deposited on a metal foil according to an embodiment of the present disclosure;

FIG. 6A is a circuit diagram of a total equivalent circuit of a capacitor according to an embodiment of the present disclosure;

FIG. 6B is a circuit diagram of equivalent series circuit of a capacitor according to an embodiment of the present disclosure;

FIG. 7 shows a configuration for structural capacitors;

FIG. 8A shows a lay-up configuration for an exemplary structural capacitor;

FIG. 8B shows the carbon fiber and fiberglass plies, Direct-Write-Thermal-Spray (DWTS) copper lines, and DLC sample for the partially-cured top lay-up of the exemplary structural capacitor;

FIG. 8C shows the carbon fiber and fiberglass plies, DWTS copper lines, and DLC sample for the partially-cured bottom lay-up of the exemplary structural capacitor;

DETAILED DESCRIPTION OF EXEMPLARY EMBODIMENTS

According to an embodiment of the present disclosure, a structural capacitor includes a dielectric material formed of a diamond like carbon. A structural capacitor storage system may include a plurality of the diamond-like-carbon dielectrics and a structurally integrated fuse. The DLC dielectric material may have a thickness of about 1 μm thick. The DLC layer may be formed by multiple depositions, e.g., two depositions of 0.5 μm thickness, reducing the density of pinholes.

It should be appreciated that measurements recited herein are not intended to be limiting but are instead exemplary embodiments of described devices. Changes may be made in the particular embodiments disclosed which are within the scope and spirit of the disclosure. Further, throughout the specification the following abbreviations and symbols may be used:

second: sec; gram: gm; millisecond: msec; ohm: Ω; micrometer: μm; foot: ft.

Figure 1A:
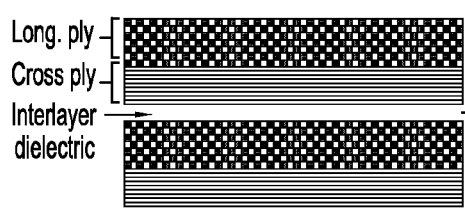
FIG. 1 is a diagram of a structural capacitor according to an embodiment of the present disclosure.
Figure 1B:
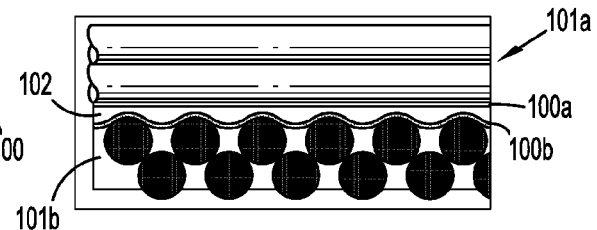

A structural capacitor according to an embodiment of the present disclosure includes an interlayer dielectric 100 including DLC material having a thickness of about a 1 μm (see FIGS. 1A-B) in a laminate. The energy storage per unit area of the interlayer dielectric 100 is a factor of 90 greater than that of paper and the structural deficit is lower because of the greater strength of DLC and the smaller relative cross-sectional area in the structure occupied by DLC vs. paper. The exemplary drawing shown in FIG. 1B shows a first layer of DLC 100a deposited directly on the surface of a sheet of carbon-fiber/epoxy prepreg (pre-impregnated composite material) 101a and a second layer of DLC 100b deposited directly on the surface of another sheet of carbon-fiber/epoxy prepreg 101b. The DLC layers 100a-b are bonded together by a epoxy layer 102.

In FIG. 1B, the epoxy layer 102 is shown as the bonding agent between the DLC layers 100a-b. It can be difficult to obtain a good pinhole free dielectric film having a thickness of about 0.5 μm on the irregular surface of a carbon-fiber/epoxy prepreg; and in the lamination process the second epoxy layer 102 between the DLC layers 100a-b adds to the thickness of the interlayer dielectric 100 and decreases the capacitance and the energy storage capacity.

Figure 2:
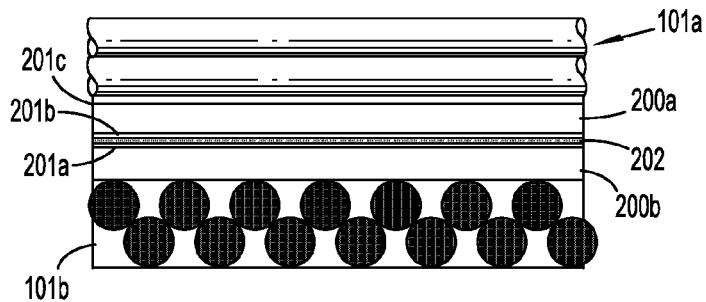
FIG. 2 is a diagram of a structural capacitor having a diamond-like carbon (DLC) film deposited on a side of an aluminum foil according to an embodiment of the present disclosure.

In the exemplary embodiment shown in FIG. 2, thin metal foils 200a-b are used as the substrate for DLC deposition. The DLC layers 201a-b having about 0.5 μm thickness are coated on one side of respective metal foils 200a-b. The DLC layers 201a-b are then over coated with a bonding agent 202 such as Parylene, which bond the DLC layers 201a-b together in the lamination process. Epoxy resin in the carbon-fiber/epoxy prepregs can be used to bond the metal foil 200a-b to respective carbon-fiber/epoxy prepregs 101a-b. The metal foils 200a-b serve as the capacitor plates. With thin metal foils 200a-b such as 3 μm thick stainless steel, the film stress tends to bend the substrate so that stacking and laminating the sheets may be difficult.

Figure 3:
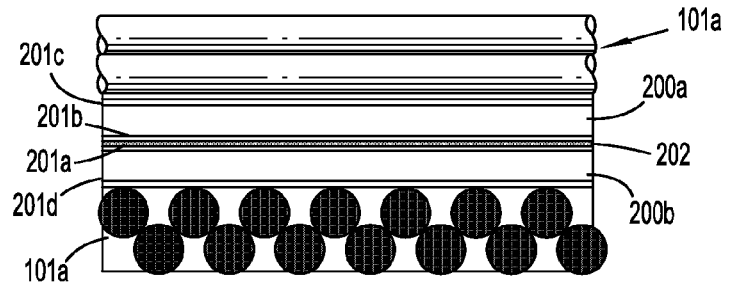
FIG. 3 is a diagram of a structural capacitor having DLC films deposited on an aluminum foil according to an embodiment of the present disclosure.

In FIG. 3, the metal foils 200a-b are coated on both sides with DLC films 201a-d and the bending forces are more balanced so that the sheets are flatter and more easily stacked and laminated. In the structures shown in FIG. 2 and FIG. 3, shear stresses may cause delamination and failure of the bond at the DLC/DLC interface.

Figure 4:
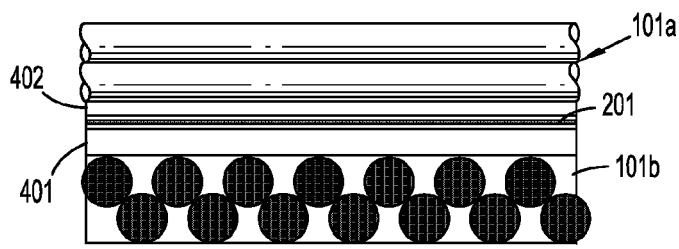
FIG. 4 is a diagram of a structural capacitor having DLC films deposited on a metal foil according to an embodiment of the present disclosure.

In FIG. 4, the DLC film 201 is deposited on a stainless steel foil 401. The stainless steel foil 401 has thickness of about 3 μm. The DLC film 201 may be deposited in two deposition runs of 0.5 μm thick each to give a total thickness of 1.0 μm pinhole free. The DLC film 201 is over coated with a stainless steel layer 402. The stainless steel layer 402 has a thickness of about 1.0 μm and serves as the top plate of the capacitor. The stainless steel foil 401 and the stainless steel layer 402 are laminated to the respective carbon-fiber/epoxy prepregs 101a-b to give the final structural capacitor. The structural deficit is minimized by the high strength of the metal foil and the small cross-sectional area of the capacitor.

In FIG. 5, an exemplary DLC-based fiberglass/epoxy composite capacitor configuration is shown. The capacitor comprises DLC films 501a and 501b deposited on both sides of a stainless steel foil 502 having a thickness of about 3 μm. The DLC films 501a and 501b are each overcoated with about 0.1 μm thick stainless steel thin film 503a and 503b, which serves as the top electrodes of the capacitor. The fiberglass/epoxy prepregs 101a-b are laminated to the respective stainless steel thin film 503a-b to give a structural capacitor 500. The capacitors on two-sided DLC structure are connected in parallel to double the capacitance.

According to an embodiment of the present disclosure, high performance structural capacitors can be obtained using DLC as a dielectric or a polyimide sheet (e.g., such as that sold under the trade name KAPTON®) (see Table 1). Polyimide sheets may be low tensile strength, e.g., about 110 MPa (Megapascal) as compared to GPa (Gigapascal) for the carbon fiber/epoxy composite.

TABLE 1

| Dielectric Material | $\epsilon_r$ | Thickness (μm) | Cap./Area (μF/m$^2$) | Breakdown (kV/mm) | Energy (J/m$^2$) | $V_{max}$ (volt) |
|---|---|---|---|---|---|---|
| Paper/Epoxy | 2.7 | 40 | 0.60 | 15 | 0.11 | 600 |
| DLC | 3.5 | 1 | 31.0 | 800 | 9.92 | 800 |
| Kapton | 3.5 | 7.6 | 4.08 | 118 | 1.64 | 897 |

The DLC films described in exemplary embodiments may be foamed to have different thicknesses depending on the application. For example, the DLC film may be formed in two deposition-run layers of DLC films (0.5-μm thick per layer) on both sides of the stainless steel foil; the DLC film may be formed in two deposition-run layers of DLC films (1.25 μm thick per layer) on both sides of the stainless steel foil; the DLC film may be formed in one layer of 1 μm thick DLC film on both sides of the stainless steel foil; etc. In another example, the DLC films may be deposited on both sides of a 2.74 μm thick substrate such as optically smooth (e.g., 0.05 μm surface roughness) 302 stainless steel foil. Still other thicknesses are possible.

Referring now to the DLC film, stainless steel thin-film electrode deposition, defects clearing, and RF characterization:

A clearing process may isolate defects in the DLC dielectric. Specifically, as a result of the manufacturing process of the DLC dielectric film, certain defects may occur such as pinholes, cracks, thin spots, foreign particles and structural discontinuities. During operation of the capacitor in an electrical circuit, electrical breakdowns can occur at these low voltage strength defects. A clearing process can be used to eliminate these unwanted breakdowns if at least one of the capacitor electrodes is a thin metal (e.g., 0.01-0.1 μm).

In the clearing process a portion of the thin electrode directly above or below the defect is removed, evaporated, or oxidized due to discharge such that the section of the dielectric containing the defect is electrically isolated from the remaining electrodes. This can be accomplished by the application of an increasing sweep or step voltage to the electrodes by a voltage source.

According to an embodiment of the present disclosure, a 3-frequency curve fitting approach may be used for the separation of the dielectric loss from the conductor loss of a capacitor. The total equivalent circuit of a capacitor is shown in FIG. 6A, where C is the capacitance, $R_p$ represents the parallel resistance due to imperfections in the dielectric, and $R_s$ represents the series resistance due to contacts, electrodes, leads, etc. The total equivalent circuit shown in FIG. 6A can be converted to a series circuit shown in FIG. 6B, where f is the frequency. The total dissipation factor of a capacitor ($DF_t$) can be derived and expressed as $$DF_t = (2\pi fCR_s) + \frac{1}{(2\pi fCR_p)}\left(1 + \frac{R_s}{R_p}\right)$$

Typically, the parallel resistance is much larger than the series resistance (i.e., $R_p \gg R_s$) so that $$DF_t = (2\pi fCR_s) + \frac{1}{(2\pi fCR_p)} = DF_c + DF_d$$

where $DF_c = (2\pi fCR_s)$ is the conductor dissipation factor, and $DF_d = (2\pi fCR_p)^{-1}$ is the dielectric dissipation factor.

To solve the two unknowns $R_s$ and $R_p$, the capacitance and dissipation factor at two adjacent frequencies can be measured and both $R_s$ and $R_p$ may be assumed to stay constant at these two frequencies. Alternatively, the capacitance and dissipation factor may be measured at three adjacent frequencies and curve fitting ($DF_t$ versus $2\pi fCR_s$) may be used to obtain the values of $R_s$ and $R_p$. Once the values of $R_s$ and $R_p$ are known, the conductor dissipation factor $DF_c$ and the dielectric dissipation factor $DF_d$ may be determined. The dielectric dissipation factor of the DLC films has been characterized at 100 KHz based on this 3-frequency (50 kHz, 100 kHz, and 200 kHz) curve fitting approach.

Referring now to the structural capacitor construction and characterization:

It has proven difficult to reliably clear out the defects in large area (2"×2") DLC capacitors, while DLC capacitors with smaller (~1"×1") electrode area are typically defect-clearable. Therefore, a structural-capacitor configuration (e.g., FIG. 7) designed by dividing the larger electrode into several well-separated smaller electrodes can be used for the construction of structural capacitor. Two DWTS copper lines 701 and 702 on a bottom lay-up including a bottom carbon-fiber/epoxy prepregs 703 and a bottom fiberglass/epoxy prepregs 713. The DWTS copper lines 701 and 702 are used to connect electrically to a stainless steel foil 704 and bottom stainless steel film electrodes, e.g., 705 on a bottom DLC film 706, respectively. A copper line 707 on a top lay-up comprising a top carbon-fiber/epoxy prepregs 708 and a top fiberglass/epoxy prepregs 712 is used to connect electrically to the defect clearable stainless steel film electrodes (marked √ in FIG. 7, e.g., 709) on a top DLC film 710. As shown in FIG. 7, four circular stainless steel thin-film electrodes having a diameter of about ¾" are separated by about ¼" on DLC film having an area of about 3"×3". A fiberglass/epoxy prepreg, e.g., 714 and 715 are formed over a portion of the top and bottom fiberglass/epoxy prepregs 712 and 713 and a portion of copper lines formed thereon.

The exemplary configuration of FIG. 7 can also handle the case that some of the capacitors are not defect clearable or damaged. For example, on the top of DLC film 710, one of the four capacitors 711 is illustrated as being defect unclearable. As a result, the DWTS copper line patterns 707 on the top lay-up are modified so that it makes no electrical contact to the defect capacitor 711. More particularly, the DWTS copper line pattern is not extended to an area 716 that would contact the damaged capacitor 711 after lay-up. In other words, if some capacitors are not clearable or damaged they can be left isolated by appropriate modification of the corresponding DWTS copper pattern.

An exemplary structural capacitor was constructed using 2-deposition-run, 3 μm thick, web-coater deposited DLC sample 801 provided by K Systems Corporation. The lay-up configuration and the sketches for the top and bottom lay-up are shown in FIG. 8A.

The partially-cured top and bottom lay-ups 802 and 803 are shown in FIG. 8B and FIG. 8C, respectively. The top lay-up 802 and bottom lay-up 803 have an area of about 5"×5" and 6"×5", respectively. The DWTS copper lines 804 of the top lay-up 802 have a width of about 0.16" and a length of about 3.5". The DWTS copper lines 804 and fiberglass/epoxy prepregs 805 are exposed through the fiberglass/epoxy prepreg, e.g., 806. A location of the DLC sample 801 in relation to the DWTS copper lines 804 is illustrated by the dotted lines.

It should be understood that prior art capacitors using paper in the carbon fiber/epoxy composite are manufactured in an uncured condition. According to an embodiment of the present disclosure, the top and bottom lay-ups are combined while in a partially-cured state, which has a high adhesion (stickiness) as compared to uncured components.

It should be appreciated that the present disclosure is not limited to stainless steel metal foil DLC substrates. One of ordinary skill in the art would recognize that other materials may be used. The substrate for the deposition of the DLC needs to be a conductor because it serves as the center electrode of the two sided capacitor. The substrate should also be smooth, strong and have a good CTE (coefficient of thermal expansion) match to DLC and the composite carbon fiber/epoxy and fiberglass/epoxy (3.3-4.8 parts-per-million/° C.). The electrode material should be low in density, electrochemically compatible with carbon and available in thin foil form in production quantities. For example, common ferrous metals and alloys have good CTE, while alloys like Invar (CTE of 1.3 to 2.1 parts-per-million/° C. in the temperature range 30-200° C.) and Rodar (CTE of 4.9 parts-per-million/° C.) are a better match than 302 stainless steel. Another material that matches the CTE of the structural composite is pure molybdenum metal with a CTE of 4.8 parts-per-million/° C. These materials are available as thin metal foils and have electrical conductivity comparable to that of the 302 stainless steel so they may be substituted for the center electrode of the structural capacitor and significantly decrease the thermal expansion mismatch between the metal center electrode and the DLC dielectric and virtually eliminate the mismatch with the structural composite.

Figure 9:
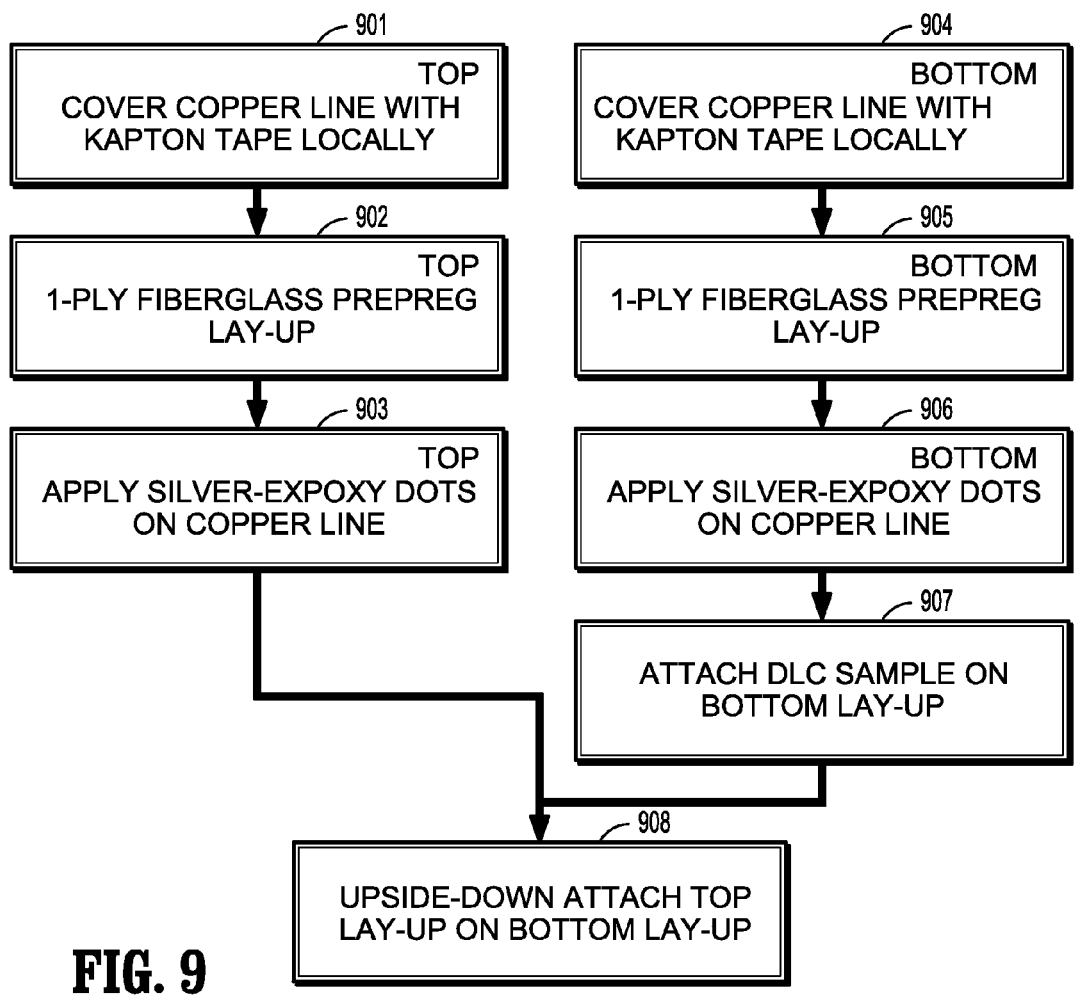
FIG. 9 is a flow diagram of a method for lay-up of the structural capacitor of FIGS. 8 and 9.

FIG. 9 is a flow diagram of a method for lay-up of the structural capacitor of FIGS. 7 and 8A. For a top portion and a bottom portion, a copper line is covered locally with a KAPTON tape 901/904 for preventing the electrical shorting of the copper line to the edge of stainless steel foil. One or more plies of fiberglass/epoxy prepreg 902/905 are applied over the copper lines to electrically insulate a portion of the copper lines from the stainless steel foil. A lower viscosity and longer pot life silver epoxy EPO-TEK® H20F was used for lay-up 903/906 to improve the electrical contact quality and to prevent damaging the DLC sample. Silver epoxy dots are applied 903/906 by a dispensing tool. The DLC sample was placed at the desired location manually 907 and the top portion and bottom portion are brought together 908.

In a fully-cured structural capacitor of FIG. 9, the measured DC resistance values indicate among six capacitors initially two capacitors are well-shorted electrically; two capacitors are partially-shorted but seem to be still functional; and two capacitors have excellent insulation resistance. Note that it is confirmed that carbon-fiber plies are isolated electrically from each other and from other conductive parts by the fiberglass/epoxy layer.

Referring now to the structural integrated fuse:

Fuses are needed in structural capacitor banks to electrically isolate any shorted capacitors from the remaining capacitors in the array. One fuse may be connected in series with each capacitor and the capacitors are arranged in parallel/series circuits. The capacitors and fuses can be integrated into structural materials such as graphite/epoxy or fiberglass/epoxy composites that form the structural members of a substrate (e.g., an aircraft, vessel, vehicle, building, etc.) where the capacitor energy storage is needed. A structurally integrated fuse device with a small structural debit is needed for a structural capacitor storage system.

According to an embodiment of the present disclosure, a structural fuse uses a deflagration type fuse wire such as PYROFUZE® wire commercially available from Sigmund Cohn Corporation. PYROFUZE is an example of an exothermic fuse material. The wire is a composite of the elements palladium (Pd) and aluminum (Al) in intimate contact with each other. When the wire is heated to an initiation temperature (e.g., about 650° C.) the Pd and Al react exothermically resulting in deflagration. The wire is heated by the reaction to temperatures above the boiling points of the constituents.

Figure 10B:
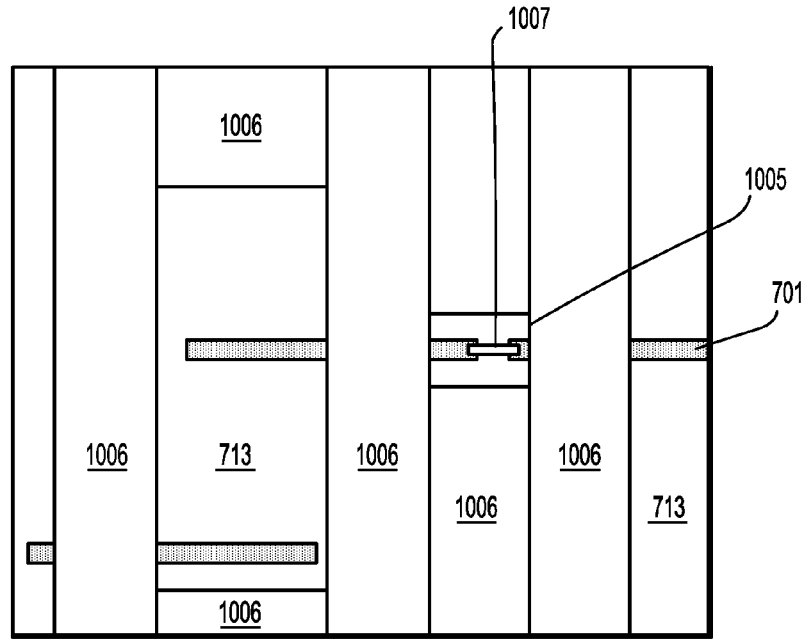
FIG. 10 is a structural integrated fuses and capacitors.
Figure 10A:
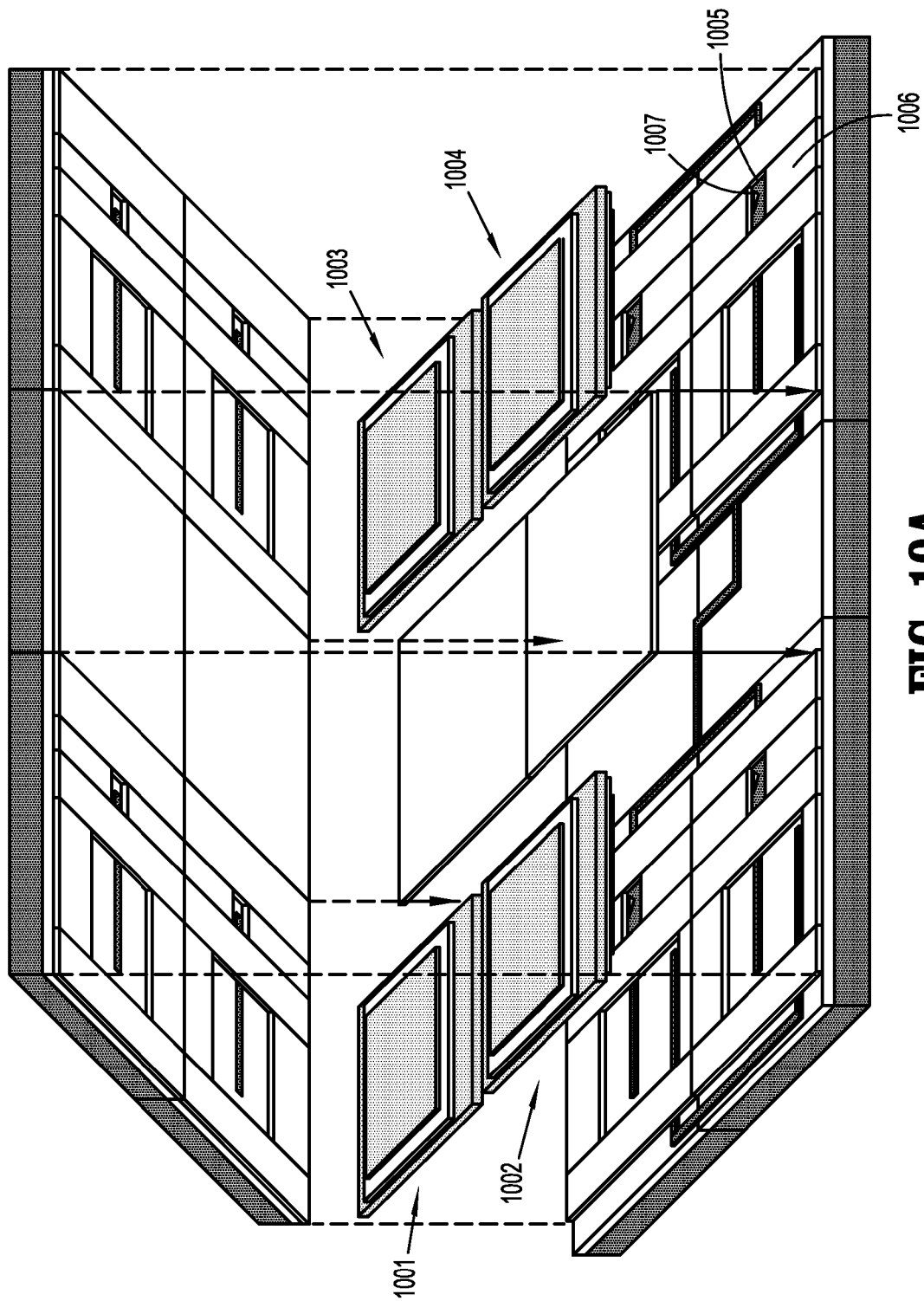

Referring to FIG. 10A, a structural fuse is comprised of a sheet of insulating structural composite material such as fiberglass/epoxy. In FIG. 10A, an array of four capacitors with each capacitor connected in series to a PYROFUZE for protection; a pair of capacitors connected in parallel is connected in series with another pair of capacitors connected in parallel. A cavity 1005 is formed during the lay-up of the fiberglass/epoxy ply 1006. Each PYROFUZE wire 1007 is placed inside the cavity and soldered to the DWTS copper lines on the bottom fiberglass/epoxy plies. The top fiberglass/epoxy plies are used to create a void space over the PYROFUZE wire so that the vaporized fuse materials have some place to go. Since fiberglass/epoxy composite is both electrically and thermally insulating, incidental contact of the PYROFUZE wire to it will have very little effect on the fusing current.

For a long fuse wire the thermal resistance of the long thin wire is great enough that the heat conduction to the contact pads can be neglected and the heating can be treated with an adiabatic approximation:

$$Q = C_p(\Delta T)(\text{Vol})(\text{Den})$$

where Q is the heat input, $Q = t(I^2)R$, $C_p$ is the heat capacity of the Pd/Al composite wire in cal/gm, Vol is the volume, $\text{Vol} = A \times L$, $A = 5.067 \times 10^{-6}$ cm$^2$, and L is the length of wire in cm, Den is the density, 7.4 gm/cm$^3$ according to the manufacture's product information.

Thus, $$t(I^2)R = C_p(\Delta T)(A \times L)(\text{Den})$$

Replacing the electrical resistance R by $R = \rho(L/A)$ and rearranging gives:

$$(I^2) = (C_p/\rho)(\Delta T/t)A^2(\text{Den})$$

Showing that in the adiabatic case the current for ignition is independent of the length of the wire. Substituting numerical values gives:

$$(I^2) = (4.186 \text{ J/cal})(0.0653 \text{ cal/gm-}°\text{C.})(630°\text{ C.}/200 \times 10^{-3} \text{ sec})(5.067 \times 10^{-5} \text{ cm}^2)(7.4 \text{ gm/cm}^3) = 0.32 \text{ amp}^2$$

$$I = 0.568 \text{ amps}$$

For short lengths of fuse wire the contact pads may also serve as heat sinks for the fuse so the fuse current can be controlled by controlling the length of PYROFUZE wire between the contact pads.

The relationship between fuse current and wire length can be analyzed using a one dimensional (1D) heat flow model that has been found to be in good agreement with experimental data once the larger adiabatic heating contribution is subtracted. For a fuse trigger current measured on a series of test fuses with a small range of fuse wire lengths, the effective length of fuse wire was obtained by measuring the resistance of the fuse wire and the known resistance per unit length ($L = R/62$ Ω/ft). In the 1D heat flow model it is assumed the heat input Q from the current is carried away through the wire to the solder joints on the copper contacts so we can use an "Ohm's law" type of heat flow equation:

$$Q = C(\Delta T)$$

where $\Delta T = (T[\text{ignition}] - T[\text{ambient}])$, Q is the heat current and C is the heat conductance. [Ohm's law analogy, $I = V/R$]

Q is the power $(I^2)R$ dissipated in the fuse wire times the time (t) expressed:

$$Q = t(I^2)R$$

where I is the ignition current of the fuse. The heat conduction is given by the equation:

$$C = \kappa A/L$$

where $\kappa$ is the thermal conductivity of the wire, A is the cross sectional area of the wire and L is the length of wire from contact to contact.

The electrical resistance may be given by $R = \rho L/A$ where $\rho$ is the electrical resistivity of the wire.

Substituting $Q = t(I^2)R$ for Q in $Q = C(\Delta T)$ and the expressions for C and R gives:

$$t(I^2)\rho(L/A) = \kappa(A/L)(\Delta T)$$

where the relationship between $t(I^2)$ and $L^2$ may be given by:

$$t(I^2) = \text{Constant}/(L^2)$$

where the constant $= (\kappa/\rho)(A^2)(\Delta T)$.

PYROFUZE trigger current vs. the length of the fuse wire was plotted according to $t(I^2) = \text{Constant}/(L^2)$ with $(I^2)$ vs. $1/L^2$. It was observed that if a length independent value of 0.17 amp$^2$ was subtracted from each data point the constant $C = 3.4 \times 10^{-3}$ (amp$^2$-sec-cm$^2$) gives the calculated line that follows the data points. The time to fuse was taken as 100 msec, the average measured time to fuse. The constant C was obtained by fitting one data point. The numerical value of the constant can also be calculated from the properties and diameter of the wire. The resistance per foot of the wire is 62 Ω/ft of 0.001" diameter wire, which corresponds to a resistivity of $1.03 \times 10^{-3}$ Ωcm. The thermal conductivity is not known but it can be estimated using the Wiedermann-Franz-Lorenz law for metals relating the thermal and the electrical conductivity:

$$\kappa/\sigma T = CWFL = 2.44 \times 10^{-8} \text{ W}\Omega\text{K}^{-2}$$

Based on the room temperature electrical conductivity $(\sigma = 1/\rho = 9.7 \times 10^4 \text{ }(\Omega\text{-cm})^{-1})$ the thermal conductivity at the fuse ignition temperature of 650° C. (923° K) is 2.185 W/cm-K. Using these values for $\kappa$ and $\rho$, the calculated constant has a value of $4.9 \times 10^{-3}$ (amp$^2$-sec-cm$^2$) as compared to the empirical value of $3.4 \times 10^{-3}$ (amp$^2$-sec-cm$^2$) showing good agreement considering the uncertainty in the thermal conductivity value and giving evidence that the model is a good approximation.

The model shows that the fuse trigger current is almost independent of the length of the wire because of the large adiabatic heating. For short wire lengths there is a small increase in trigger current, which is inversely proportional to the length of wire. For a fuse current of 0.15 amps and a fuse time of 100 msec a smaller diameter PYROFUZE wire would have to be used to decrease that adiabatic heating required to reach the trigger current.

Having described embodiments for a capacitor having a structural capacitor storage system having a diamond-like-carbon dielectric, it is noted that modifications and variations can be made by persons skilled in the art in light of the above teachings. It is therefore to be understood that changes may be made in the particular embodiments of the invention disclosed which are within the scope and spirit of the disclosure.

What is claimed is:

1. A structural capacitor, comprising:
   a first carbon fiber material layer;
   a substantially flat metal foil layer disposed on top of the first carbon fiber material layer;

a first interlayer dielectric including a diamond-like-carbon material layer laminated on a bottom surface of the metal foil layer, the first interlayer dielectric disposed between the metal foil layer and the first carbon fiber material layer;

a second interlayer dielectric including a diamond-like-carbon material layer laminated on a top surface of the metal foil layer, the second interlayer dielectric disposed between the metal foil layer and a second carbon fiber material layer; and the second carbon fiber material layer disposed on top of the second interlayer dielectric.

2. The structural capacitor of claim 1, wherein a first plurality of capacitors is formed between the metal foil layer and the first carbon fiber material layer and a second plurality of capacitors is formed between the metal foil layer and the second carbon fiber material layer.

3. The structural capacitor of claim 1, further including a first plurality of metal film electrodes disposed between the first interlayer dielectric and the first carbon fiber material layer and a second plurality of metal film electrodes disposed between the second interlayer dielectric and the second carbon fiber material layer.

4. The structural capacitor of claim 3, wherein the first plurality of metal film electrodes, in association with the metal foil layer and the interlayer dielectric disposed therebetween, comprises a first plurality of capacitors and the second plurality of metal film electrodes, in association with the metal foil layer and the interlayer dielectric disposed therebetween, comprises a second plurality of capacitors.

5. The structural capacitor of claim 4, further including a first set of electrically conductive lines disposed between the first carbon fiber material layer and the first plurality of metal film electrodes and making electrical contact to each of the first plurality of capacitors and a second set of electrically conductive lines disposed between the second carbon fiber material layer and the second plurality of metal film electrodes and making electrical contact to each of the second plurality of capacitors.

6. The structural capacitor of claim 4, wherein the first and second set of capacitors together includes at least one functioning capacitor and at least one defective capacitor and the structural capacitor further includes:

a first set of electrically conductive lines disposed between the first carbon fiber material layer and the first plurality of metal film electrodes and making electrical contact to each of the first plurality of capacitors that a functioning capacitor and not making electrical contact to any of the first plurality of capacitors that are defective; and a second set of electrically conductive lines disposed between the second carbon fiber material layer and the second plurality of metal film electrodes and making electrical contact to each of the second plurality of capacitors that is functioning and not making electrical contact to any of the second plurality of capacitors that is defective.

7. The structural capacitor of claim 5, wherein each electrically conductive line of the first and second sets of electrically conductive lines includes a fuse that is configured to sever a corresponding connection between a corresponding metal line and a corresponding metal film electrode when it is determined that a corresponding capacitor corresponding to the corresponding metal film electrode is defective.

8. The structural capacitor of claim 3, wherein all of the first plurality of metal film electrodes are coplanar with respect to each other and all of the second plurality of metal film electrodes are coplanar with respect to each other.

9. The structural capacitor of claim 1, wherein the first and second carbon fiber material layers are carbon fiber/epoxy prepregs and are not capacitor electrodes for the structural capacitor.

10. The structural capacitor of claim 3, wherein the only capacitor electrodes of the structural capacitor include the first and second pluralities of metal film electrodes and the metal film layer.

* * * * *